(12) United States Patent
Su et al.

(10) Patent No.: US 6,275,435 B1
(45) Date of Patent: Aug. 14, 2001

(54) BI-DIRECTIONAL SENSE AMPLIFIER STAGE FOR MEMORY DATAPATH

(75) Inventors: Jason Su, Cupertino, CA (US);
Ching-Hua Hsiao, Hsinchu (TW);
Lidon Chen, Sunnyvale, CA (US);
Howard C. Kirsh, Austin, TX (US)

(73) Assignee: Vanguard International Semiconductor Corp., Hsinchu (TW)

( * ) Notice: Subject to any disclaimer, the term of this patent is extended or adjusted under 35 U.S.C. 154(b) by 0 days.

(21) Appl. No.: 09/282,757

(22) Filed: Mar. 31, 1999

(51) Int. Cl.[7] ....................................................... G11C 7/02
(52) U.S. Cl. ............................ 365/207; 365/205; 365/202
(58) Field of Search ............................ 365/207, 205, 365/190, 233, 198, 202, 203

(56) References Cited

U.S. PATENT DOCUMENTS

| | | | |
|---|---|---|---|
| 5,315,555 | * 5/1994 | Choi | 365/207 |
| 5,561,630 | 10/1996 | Katoh et al. | |
| 5,646,900 | * 7/1997 | Tsukude et al. | 365/205 |
| 5,717,645 | * 2/1998 | Kengeri et al. | 365/230.01 |
| 5,757,707 | 5/1998 | Abe | |
| 5,774,407 | 6/1998 | Kim | |
| 5,808,487 | 9/1998 | Roy | |
| 5,867,443 | 2/1999 | Linderman | |
| 6,075,736 | * 6/2000 | Kim et al. | 365/207 |
| 6,088,291 | * 7/2000 | Fujioka et al. | 365/233 |
| 6,091,651 | * 7/2000 | Furutani et al. | 365/202 |

* cited by examiner

Primary Examiner—Richard Elms
Assistant Examiner—Vanthu Nguyen
(74) Attorney, Agent, or Firm—Jiawei Huang; J.C. Patents

(57) ABSTRACT

A sense amplifier (SA) stage includes a single SA used to selectively sense signals from both directions in a datapath. The SA is connected to detect the differential signal present at a pair of sense nodes on the datapath. A first pair of switches is inserted in the datapath between the sense nodes and a first transfer port (FTP). A first equalizer is connected to the differential lines at points between the first pair of switches and the FTP. A second pair of switches is inserted in the datapath between the sense nodes and a second transfer port (STP), with a second equalizer connected to the differential lines between the second pair of switches and the STP. Before transferring data from the FTP to the STP, the first equalizer is turned on while the first pair of switches is turned off. While the data is being developed at the FTP, the first equalizer is turned off, the first pair of switches is turned on, the second pair of switches is off, and the second equalizer is on. Then the first pair of switches is turned off, the first equalizer is turned on, and the SA is enabled. While the SA is enabled, the second pair of switches is turned on and the second equalizer is turned off. The SA senses and drives the data signal to the STP. To transfer data from the STP to the FTP, this same sequence is performed, replacing "first" for "second" and vice versa.

27 Claims, 13 Drawing Sheets

BI-DIRECTIONAL SENSE AMPLIFIER STAGE FOR MEMORY DATAPATH

FIELD OF THE INVENTION

The present invention relates to electronic circuits and, more particularly, to sense amplifier circuits for use in a datapath. Still more particularly, the present invention relates to bi-directional sense amplifiers for use in a memory datapath.

BACKGROUND OF THE INVENTION

Electronic circuits commonly transmit data signals over relatively long datapaths. However, the signal may be corrupted by RC losses and noises incurred while the signal propagates along the datapath. To facilitate accurate transmission and increase sensitivity to low-level signals, the signal may be implemented as a differential signal. Further, sense amplifier stages may be inserted in the datapath at intervals to restore the. signal to full rail voltage levels. For example, a memory circuit may include differential datapaths from the memory cells to the output buffers, with sense amplifier stages at various points of the datapath.

The datapath can be bi-directional. For example, in some memory circuits, a memory cell is read and written using the same datapath. In these types of circuits, the conventional approach is to use a sense amplifier for each direction; i.e., as used herein, such a conventional sense amplifier stage for a bi-directional datapath has two sense amplifiers, one for each direction. FIG. 1 illustrates part of a memory circuit 10 using such a conventional approach. Memory circuit 10 includes a datapath implemented with datalines DLB and DL. The sense amplifier stage has a read mode sense amplifier $11_1$ and a write mode sense amplifier $11_2$. The read mode sense amplifier $11_1$ is connected to datalines DLB and DL at nodes $N11B_1$ and $N11_1$, respectively. As is common in certain types of memory devices, a passgate 12 is connected between datalines DLB and DL at nodes N12B and N12.

In preparation to a memory read operation, passgate 12 is controlled by signal EQUALIZE to provide a conductive path between datalines DLB and DL to equalize the dataline voltage. Memory circuit 10 also includes passgates $18_1$, $18_2$ and $18_3$, which form a precharge circuit. Passgates $18_1$, $18_2$ and $18_3$ are controlled by a signal PRECHB1, which is asserted to provide conductive paths between sense amplifier nodes $N11B_2$, $N11_2$, and a supply voltage line providing power supply voltage Vdd. Nodes $N11B_2$, $N11_2$ are electrically connected to nodes N12B and N12. Between each data transfer, signal EQUALIZE is asserted to turn on pass gate 12 to cause the voltages on datalines DLB and DL to be at substantially the same voltage level. When signal EQUALIZE is asserted while signal PRECUB1 is asserted, datalines DLB and DL are precharged to a level substantially equal to the level of supply voltage Vdd.

Memory circuit 10 also includes passgates $13_1$ and $13_2$, inserted in the datapath between the memory cell (not shown) and sense amplifier $11_1$. Passgates $13_1$ and $13_2$ are controlled by a signal DATA_EN to selectively allow a data signal from the memory cell to propagate to sense amplifier $11_1$ (e.g., in a read operation). When the data signal from the memory cell is propagated to sense amplifier nodes $N11B_1$ and $N11_1$, signal DATA_EN turns off passgates $13_1$ and $13_2$, and isolates sense amplifier $11_1$ from the wire capacitance of datalines DLB and DL. In addition, passgates $13_1$ and $13_2$ when turned off "store" the differential signals in the parasitic capacitance at nodes $N11B_1$ and $N11_1$. Now signal SAE1 is ready to strobe sense amplifier $11_1$ to amplify the data signals in nodes $N11B_1$ and $N11_1$. Signal READ enables tristate or three-state buffer $14_1$ and $14_2$ to drive the data signal to the next stage in the datapath after signal SAE1 strobes sense amplifier $11_1$. In particular, signal READ is provided so as to keep tristate buffer $14_1$ and $14_2$ in a high impedance mode before the signals are amplified to avoid large crow-bar current.

This datapath also includes passgates $15_1$ and $15_2$ connected between the datalines DLB and DL and a write sense amplifier $11_2$, respectively. More specifically, passgates $15_1$ and $15_2$ are connected to nodes N14B and N14 of datalines DLB and DL, and to nodes N15B and N15 of the input leads of sense amplifier $11_2$, respectively. Passgates $15_1$ and $15_2$ are turned on and off by signals WRITE_EN. Memory circuit 10 also includes passgates $18_4$, $18_5$ and $18_6$, which are controlled by a signal PRECHB2 to provide conductive paths between sense amplifier nodes N15B, N15, and power supply Vdd. Between each data transfer, signal PRECHB2 is asserted to turn on passgates $18_4$, $18_5$ and $18_6$ to electrically connect and precharge nodes N15B and N15 to a level substantially equal to the level of voltage Vdd.

Memory circuit 10 also includes passgates $17_1$ and $17_2$, which are connected between the output leads of inverters N15B and N15 and nodes N13B and N13 of datalines DLB and DL, respectively. Passgates $17_1$ and $17_2$ are controlled by signal WRITE. Nodes N13B and N13 are located between the memory cell (not shown) and passgates $13_1$ and $13_2$. During read operations, signal WRITE_EN, and signals WRITE are provided so as to disable passgates $15_1$ and $15_2$, and passgates $17_1$ and $17_2$, respectively. Thus, sense amplifier $11_2$ has no significant affect on datalines DLB and DL during a read operation.

In contrast, during a write operation, signal SAE1 does not strobe. Thus, sense amplifier $11_1$ does not affect the voltage on datalines DLB and DL during a write operation. In addition, during a write operation, signals WRITE_EN is provided so as to turn on pass gates $15_1$ and $15_2$, which allows sense amplifier $11_2$ to amplify the data signal on datalines DLB and DL. Signals WRITE is also provided to turn on passgates $17_1$ and $17_2$ to allow the amplified data signal to be driven by sense amplifier $11_1$ to nodes N13B and N13 of the datalines.

FIG. 2 shows the timing and the waveforms of the control signals for a write operation in memory circuit 10 (FIG. 1). As indicated by the dashed lines, there are several setup time requirements in this conventional memory circuit. For example, there is a setup time required from: (a) the rising edge of signal PRECHB2 to the rising edge of signal WRITE_EN, indicated as (t2-t1); (b) the falling edge of signal WRITE_EN to the rising edge of signal SAE2/falling edge of signal EQUALIZE, indicated by (t4-t3); (c) from the rising edge of signal SAE2 to the rising edge of signal WRITE, indicated by (t5-t4); (d) from the falling edge of signal WRITE to the falling edge of signal SAE2, indicated by (t7-t6); and (e) from the falling edge of signal SAE2 to the falling edge of signal PRECHB2, indicated by (t8-t7). These setup times need to be equal to or greater than zero to assure that the data signals are sensed and amplified properly, and driven along datalines DLB and DL in the right directions.

FIG. 3 shows the timing and the waveforms of the control signals for a read operation in memory circuit 10 (FIG. 1). As can be seen, there is also a set of setup times to meet as in a write operation. The setup times depend on the skews between the control signals. The greater the skews in the control signals, the greater the setup times need to be. If there are no skew between the control signals, the setup times can become zero. However, the control signals are typically global signals, which tend to have high skew compared with locally generated signals. The reason why the control signals are globally generated is that each signal has different pulse width and delay requirements as shown in FIGS. 2 and 3. The pulse-width modifying and delay adjustment circuits would make the chip very bulky and power consuming if implemented in the local area near each sense amplifier stage. Because of the global skews, the percentage of the useful cycle time is reduced and the frequency at which the data can be transferred decreases.

As can be seen, another problem with this approach is that it requires two sense amplifiers for each sense amplifier stage (i.e., sense amplifiers $11_1$ and $11_2$). This can result in a significant amount of area occupied by sense amplifiers in a memory circuit with a large number of memory cells and/or datapaths that require a relatively large number of sense amplifier stages. Moreover, using two sense amplifiers requires two sets of passgate control, sense amplifier enabling and precharge/equalize signals. This means that twice as many wires are needed for control, thereby further increasing the size of the memory circuit. Furthermore, when the operation is reversed from read to write, for example, the control signals cannot be symmetrically switched. That is, signal SAE2 cannot simple be switched to signal SAE1, nor signal PRECHB2 to signal PRECHB1, nor signal WRITE to signal READ, and so on. More specifically, the clock edge at which data are required to be available at the input buffers of the memory system in a write cycle is typically the same clock edge at which the data are made ready at the output buffers of the memory system in a read cycle. This constraint causes the data to appear at nodes N14B and N14 at the same time in read and in write operations, but appear at nodes N12B and N12 earlier in read operations and later in write operations. Therefore, there are also extra delays and multiplexing for the bi-directional operations.

The delay, pulse width modification and multiplexing circuitry required to achieve this timing increases the complexity, size, design costs, and fabrication cost of the circuit. Moreover, implementing the control signals globally to alleviate power and area penalty dramatically increases the skew of the control signals, which in turn degrades the performance the memory circuit can achieve. Still further, the requirement of a precharge phase during each data transfer undesirably increases the cycle time of the transfer. Accordingly, there is a need for an approach that reduces the complexity and size of a sense amplifier stage and its corresponding control circuitry while minimizing the cycle time.

SUMMARY OF THE INVENTION

In accordance with the present invention, a bi-directional sense amplifier stage is provided. According to one aspect of the present invention, the sense amplifier stage includes a single sense amplifier that is used to selectively sense signals from both directions in a datapath. The datapath is a differential signal datapath, and the sense amplifier stage includes a sense amplifier, four switches and two equalizers. The sense amplifier is connected to detect the differential signal present at a pair of sense nodes on the datapath. Further, in accordance with the present invention, the sense amplifier does not require internal precharge. A first pair of the four switches is inserted in the datapath between the sense nodes and a first transfer port. A first equalizer is connected to the differential lines of the datapath at points between the first pair of switches and the first transfer node. The second pair of switches is inserted in the datapath between the sense nodes and a second (i.e., the opposite) transfer port, with the second equalizer being connected to the differential lines of the datapath between the second pair of switches and the second transfer port.

Before transferring data from the first transfer port to the second transfer port, the first equalizer is turned on while the first pair of switches are turned off. This configuration allows the equalizer to equalize the voltage between the portion of the differential lines near the first transfer port.

Then while the data is being developed at the first transfer port, the first equalizer is turned off, the first pair of switches is turned on, the second pair of switches is off, and the second equalizer is on. The sense amplifier is also turned off. Because the first pair of switches is on and the second pair of switches is off, the data signal can develop at the sense nodes coupled to the input leads of the sense amplifier. In addition, because the second pair of switches is off, the second equalizer can equalize the voltage between the portion of the differential lines near the second transfer port.

When the data is developed at the sense nodes, the first pair of switches is turned off, the first equalizer is turned on, and the sense amplifier is enabled. This control sequence allows the sense amplifier to sense the data at the sense nodes. While the sense amplifier is enabled, the second pair of switches is turned on and the second equalizer is turned off. Thus, the sense amplifier can sense and latch the data signal and drive the data signal to the second transfer port.

To transfer data from the second transfer port to the first transfer port, this same general sequence is performed as described above in the previous three paragraphs, only replacing "first" for "second" and vice versa.

Because the sense amplifier does not require internal precharging, the cycle time can be relatively short, thereby increasing the throughput of the system. More specifically, the absence of a precharge time allows the edges of the control signals to be placed closer together in time. In a further refinement, the control signals are identical or complementary, providing that there is no skew in the control signals (which would require setup times). Thus, when changing data flow direction, there is no need to shift the edges of the control signals or to modify the duty cycles of the control signals. All of the control signals can be generated from a single clocking source.

In another aspect of the present invention, the sense amplifier stage includes a control circuit that generates the control signals with zero skew and without using local delay or pulse generating circuitry. A single clocking input is used as the source signal. The circuitry generates both inverted and non-inverted versions of the clocking source. It has RC delay matching elements to eliminate the skew between the signals complementary to each other. The control signals are thus generated by the same clocking source. Only one other control signal, either signal WRITE or signal READ, is used to achieve the desired direction of the data flow.

The absence of a precharge phase combined with a local control scheme with zero skew achieves a bi-directional datapath sense-amplifier stage design that is significantly less complex and occupies significantly less device and wiring areas than the aforementioned conventional sense amplifier stages.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
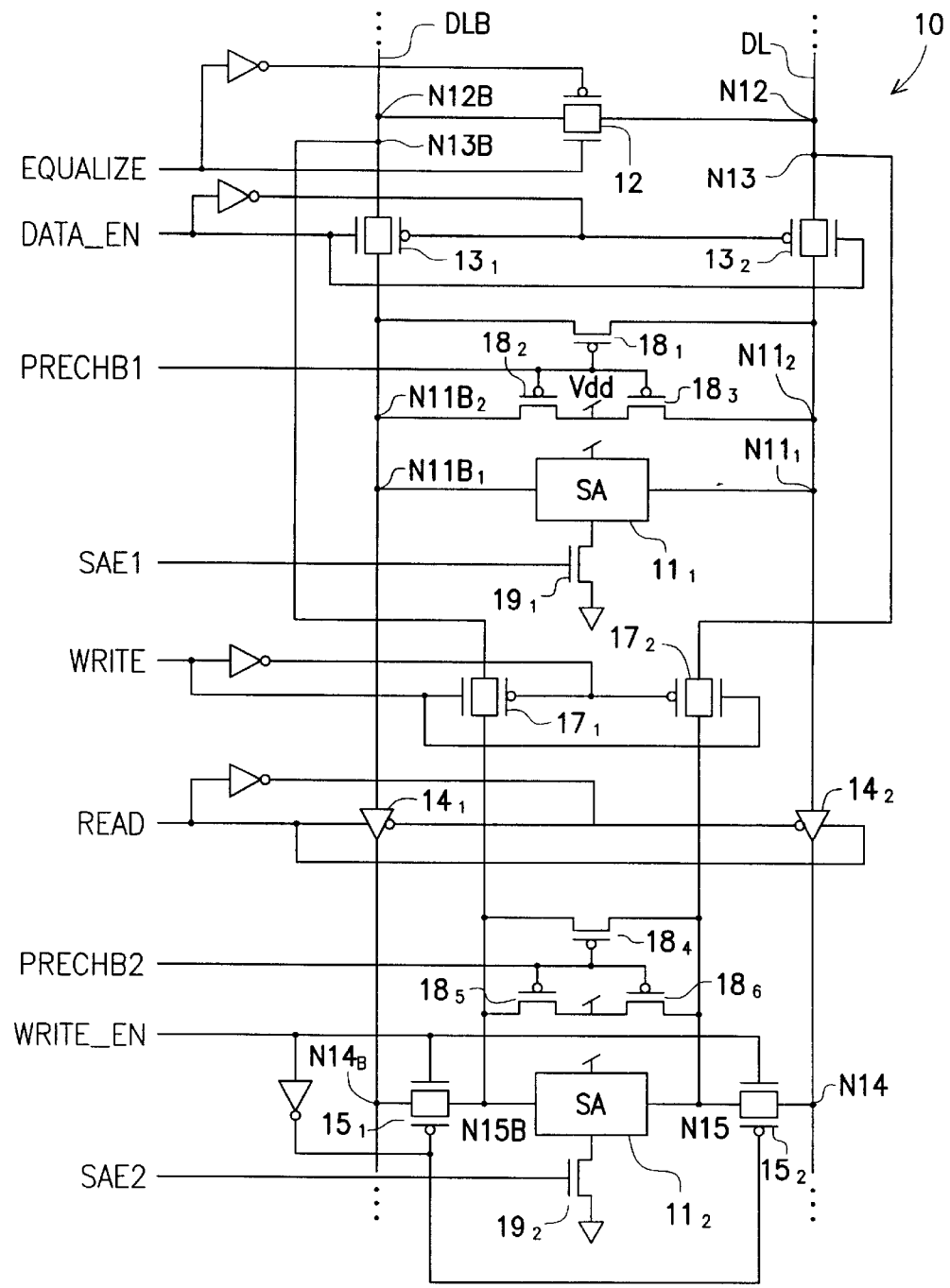
FIG. 1 is a diagram schematically illustrating a conventional bi-directional sense amplifier stage.
Figure 2:
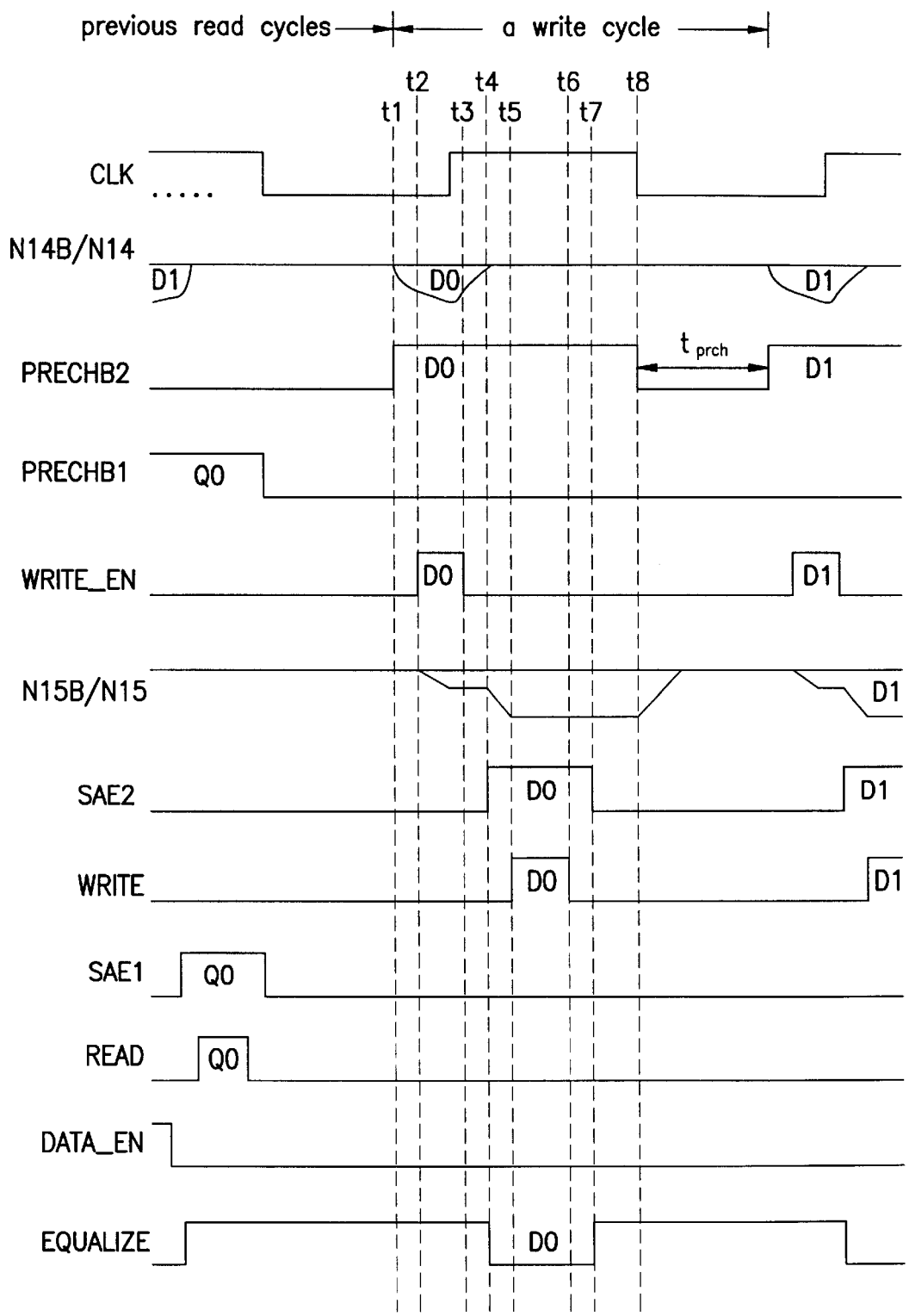
FIG. 2 is a diagram illustrating the timing of the control signals for a conventional bi-directional sense amplifier stage in write mode.
Figure 3:
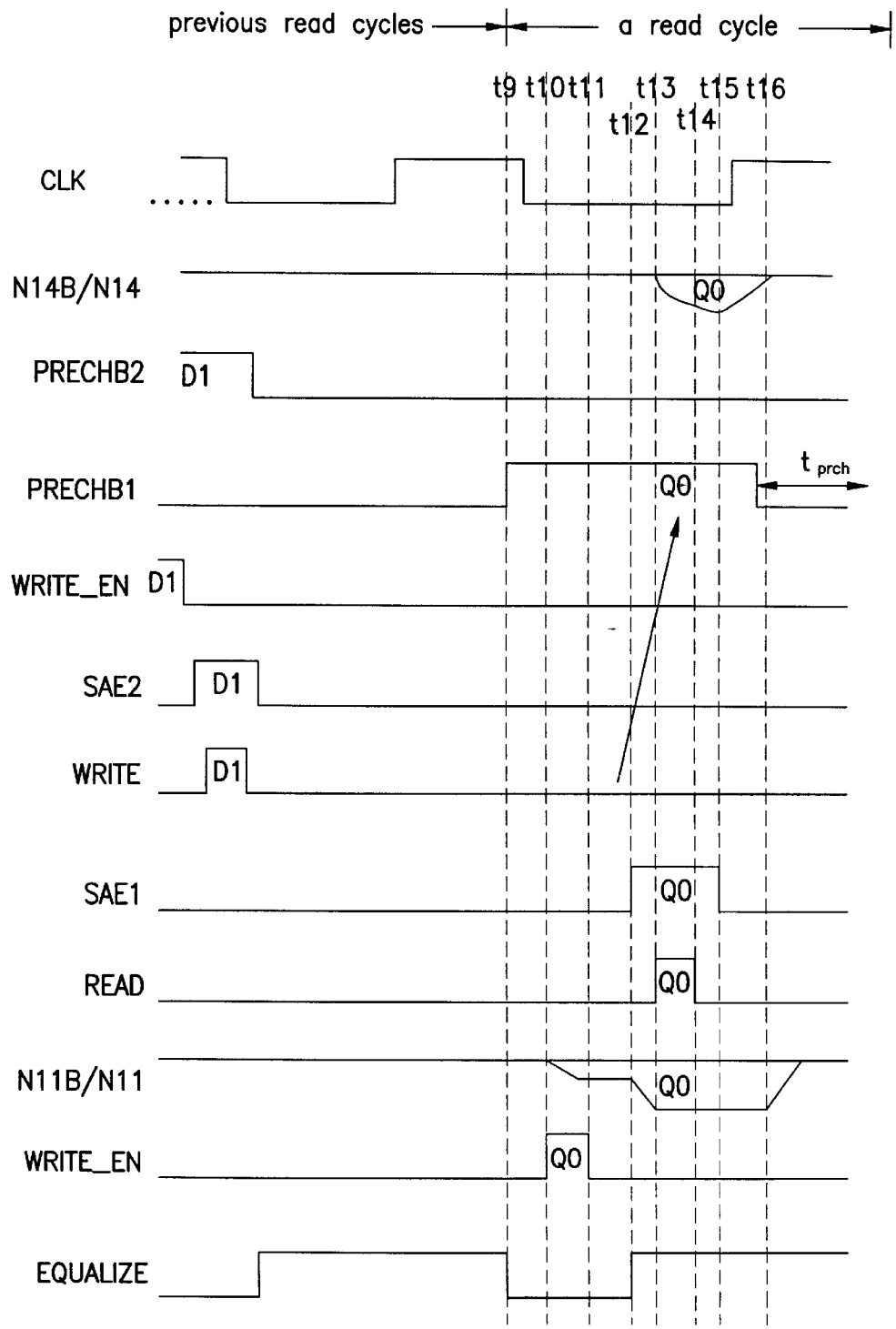
FIG. 3 is a diagram illustrating the timing of the control signals for a conventional bi-directional sense amplifier stage in read mode.
Figure 4:
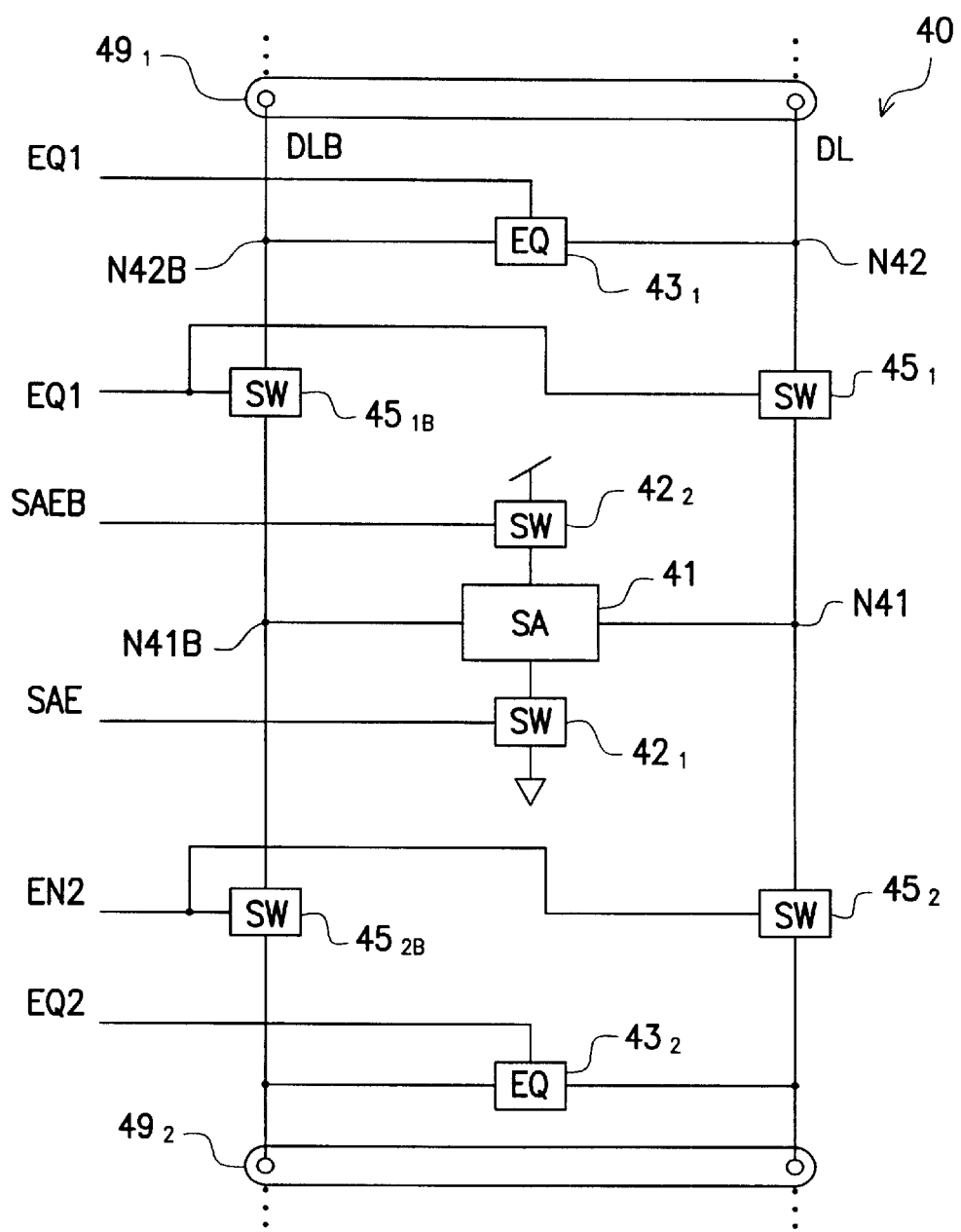
FIG. 4 is a diagram illustrating a bi-directional sense amplifier stage with one sense amplifier, according to one embodiment of the present invention.

FIG. 4 illustrates a bi-directional sense amplifier stage 40, according to one embodiment of the present invention. Sense amplifier stage 40 includes a sense amplifier 41, an equalizer $43_1$, an equalizer $43_2$, a first switch pair $45_{1B}$ and $45_1$, and a second switch pair $45_{2B}$ and $45_2$. To facilitate understanding of the present invention, the same reference designations are used among the drawings for elements having the same or similar function or structure.

SA stage 40 is interconnected as follows. Sense amplifier 41 has its input or internal leads connected to datalines DLB and DL at sense nodes N41B and N41, respectively. Sense amplifier 41 is also connected to sense amplifier enable devices $42_1$ and $42_2$. Sense amplifier enable devices $42_1$ and $42_2$ are connected to receive signal SAE and its complement, signal SAEB, from a control circuit (e.g., the control circuit described in conjunction with FIG. 5). Equalizer $43_1$ is connected to datalines DLB and DL at nodes N42B and 42, respectively. Equalizer $43_1$ is also connected to receive an equalize signal EQ1 from the control circuit. Nodes N42B and N42 are respectively located on datalines DLB and DL between sense nodes N41B and N41 and a first transfer port $49_1$. First switch pair $45_{1B}$ and $45_1$ are inserted in datalines DLB and DL at points between nodes N42B and N41B and between nodes N42 and N41, respectively. First switch pair $45_{1B}$ and $45_1$ are connected to receive an enable signal EN1 from the control circuit.

Equalizer $43_2$ is connected to datalines DLB and DL at nodes N43B and N43, respectively. Equalizer $43_2$ is also connected to receive an equalize signal EQ2 from the control circuit. Nodes N43B and N43 are respectively located on datalines DLB and DL between sense nodes N41B and N41 and a second transfer port $49_2$. Second switch pair $45_{2B}$ and $45_2$ are inserted in datalines DLB and DL at points between nodes N41B and N43B and between nodes N41 and N43, respectively. Second switch pair $45_{2B}$ and $45_2$ are connected to receive an enable signal EN2 from the control circuit as the first switch pair $45_{1B}$ and $45_1$.

Figure 5:
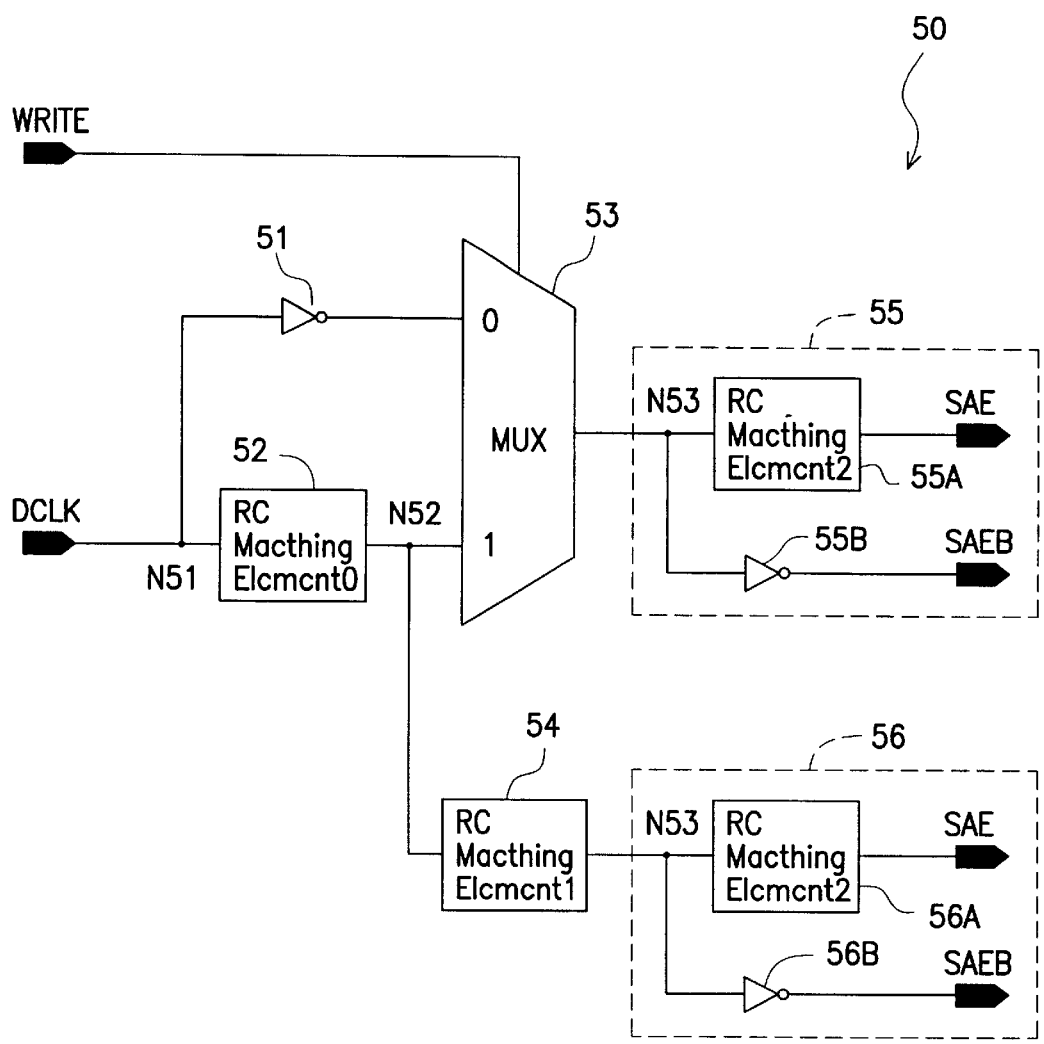
FIG. 5 is a diagram illustrating a zero-skew control signal generation circuitry for the bi-directional sense amplifier stage of FIG. 4, in accordance with one embodiment of the present invention.

FIG. 5 illustrates a control circuit 50 that generates the signals for the control of the SA stage 40. Control circuit 50 includes an inverter 51, an RC matching element 52, a multiplexer 53, a second RC matching element 54, and output buffers 55 and 56. In this embodiment, buffer 55 includes an RC matching element 55A and an inverter 55B, whereas buffer 56 includes an RC matching element 56A and an inverter 56B. RC matching elements 52, 54, 55B and 56B match the RC load of inverter 51, multiplexer 53, inverter 55A and inverter 56A, respectively.

Control circuit 50 is interconnected as follows. Control circuit 50 is connected to receive a single clocking signal DCLK at the input lead of inverter 51 and RC matching element 52. The output lead of inverter 51 and RC matching element 52 are connected to corresponding input leads of two-input multiplexer 53. The control lead of multiplexer 53 is connected to receive the read/write control signal WRITE. The output lead of multiplexer 53 is connected to the input lead of buffer 55. In particular, the output lead of multiplexer 53 is connected to the input leads of RC matching element 55A and inverter 55B, which output signals SAE and SAEB, respectively. In addition, the output lead of RC matching element 54 is connected to the input lead of buffer 56. In particular, the output lead of RC matching element 54 is connected to the input leads of RC matching element 56A and inverter 56B, which output signals EN1/EQ2 and EQ1/EN2, respectively.

By matching the RC loads: (a) RC matching element 52 matches the propagation delay through inverter 51; (b) RC delay matching element 54 matches the propagation delay through multiplexer 53; (c) RC delay matching element 55A matches the propagation delay through inverter 55B; and (d) RC delay matching element 56A matches the propagation delay through inverter 56B. In this way, clock signals DLCK and DLCKB propagate through the circuitry of control circuit 50 to form signals SAE, SAEB, EN1/EQ2 and EQ1/EN2 with minimal skew. In particular, control circuit 50 generates the signals EN1, EN2, EQ1, EQ2, SAE and SAEB with waveforms identical to that of clock signal DCLK or its inverse. In other embodiments, signals EN1, EN2, EQ1, and EQ2 may have the same or opposite phases (i.e., differing by 180°), depending on the type of the switches implemented in SA stage 40. As shown in FIG. 5, signals EN1 and EQ2 are of one phase and signals EN2 and EQ1 are of opposite phase. These phases are provided because SA stage 40 (FIG. 4) implements equalizer $43_1$ and switches $45_{1B}$ and $45_1$ with N-channel transistors, whereas equalizer $43_2$ and switches $45_{1B}$ and $45_1$ are implemented with P-channel transistors. Signal SAE has the same phase as signal EN1 in write operations, and the opposite phase of signal EN1 in read operations.

SA stage 40 operates as follows to transfer data from first transfer port $49_1$ to second transfer port $49_2$. Before transferring data from first transfer port $49_1$ to second transfer port $49_2$, first equalizer $43_1$ is turned on by equalize signal EQ1 while first switch pair $45_{1B}$ and $45_1$ are turned off by enable signal EN1. This configuration allows first equalizer $43_1$ to equalize the voltage between the portion of the differential datalines DLB and DL between first transfer port $49_1$ and first switch pair $45_{1B}$ and $45_1$.

Then while the data is being developed at first transfer port $49_1$, first equalizer $43_1$ is turned off by equalize signal EQ1, and first switch pair $45_{1B}$ and $45_1$ are turned on by enable signal EN1, while second switch pair $45_{2B}$ and $45_2$ are off in response to enable signal EN2, and second equalizer $43_2$ is on in response to equalize signal EQ2. Sense amplifier 41 is also turned off in response to signal SAE. Because first switch pair $45_{1B}$ and $45_1$ are on and second switch pair $45_{2B}$ and $45_2$ are off, the data signal can develop at sense nodes N41B and N41. In addition, because second switch pair $45_{2B}$ and $45_2$ are off, second equalizer $43_2$ can equalize the voltage between the portions of the differential datalines DLB and DL between second transfer port $49_2$ and second switch pair $45_{2B}$ and $45_2$.

When the data signal is developed at sense nodes N41B and N41 first switch pair $45_{1B}$ and $45_1$ are turned off by enable signal EN1, first equalizer $43_1$ is turned on by equalize signal EQ1, and sense amplifier 41 is enabled by signals SAE and SAEB. This control sequence allows sense amplifier 41 to sense the data at sense nodes N41B and N41. While sense amplifier 41 is enabled, second switch pair $45_{2B}$ and $45_2$ are turned on and second equalizer $43_2$ is turned off. Thus, sense amplifier 41 can drive the data signal to second transfer port $49_2$.

To transfer data from second transfer port $49_2$ to first transfer port $49_1$, this same general timing sequence is performed as described above in the previous three paragraphs, only replacing the occurrence of the switches with their corresponding opposite switches. For example, occurrences of "first switch pair $45_{1B}$ and $45_1$" would be replaced with "second switch pair $45_{2B}$ and $45_2$" in describing a data transfer from second transfer port $49_2$ to first transfer port $49_1$.

Figure 6:
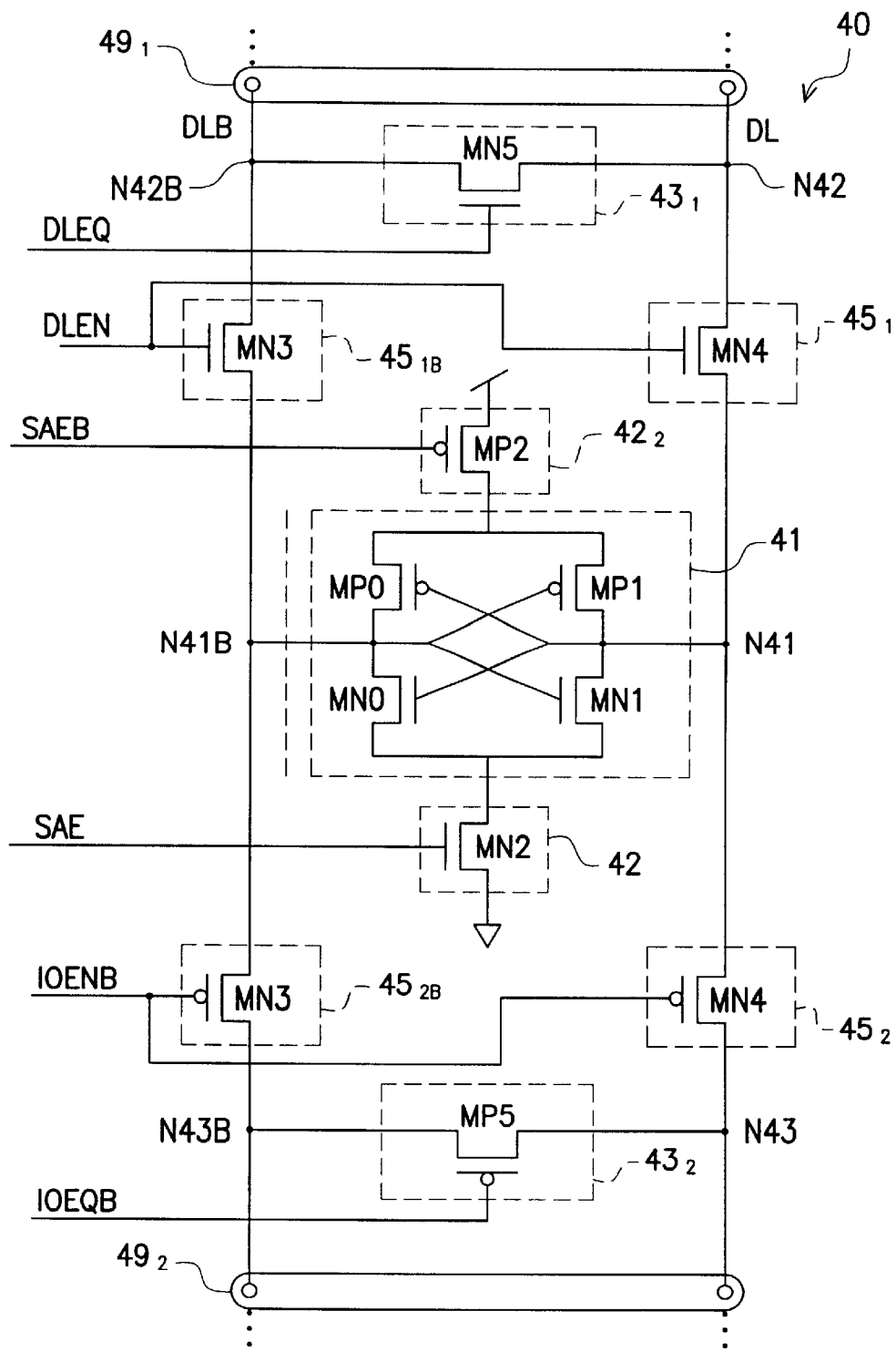
FIG. 6 is a diagram schematically illustrating one implementation of the bi-directional sense amplifier stage of FIG. 4.

FIG. 6 schematically illustrates one implementation of bi-directional sense amplifier stage 40 (FIG. 4) adapted for use in a memory circuit. In this embodiment, as will be described below, all of the control signals may have an identical waveform. In this embodiment, data transfer port $49_1$ is on the "memory cell side" of the datapath, whereas data transfer port $49_2$ is on the "I/O bus side" of the datapath. For convenience, in this embodiment, data transfer ports $49_1$ and $49_2$ are referred to herein as the DL bus and the IO bus, respectively. The names of the timing and control signals are changed relative to FIG. 4 to reflect this embodiment's memory circuit application.

In this embodiment, sense amplifier 41 is implemented with P-channel transistors MP0, MP1 and MP2, and N-channel transistors MN0, MN1 and MN2. Although sense amplifier 41 is a standard implementation, its interconnection is described below for completeness. The sources of transistors MP0 and MP1 are connected to the drain of transistor MP2, which serves as a strobe device. The source and gate of transistor MP2 are connected to receive a voltage VDD and a strobe signal SAEB, respectively. The drains of transistors MP0 and MP1 are connected to the drains of transistors MN0 and MN1, respectively. The sources of transistors MN0 and MN1 are connected to the drain of transistor MN2, which also serves as a strobe device. The source and gate of transistor MN2 are connected to receive a voltage VSS and a strobe signal SAE, respectively. Transistors MP0, MP1, MN0 and MN1 are cross-coupled. That is, the gates of transistors MP0 and MN0 being connected to the drains of transistors MP1 and MN1, and the gates of transistors MP1 and MN1 being connected to the drains of transistors MP0 and MN0. The drains of transistors MP0 and MN0 are connected to node N41B, whereas the drains of transistors MP1 and MN1 are connected to node N41.

In operation, signals SAE and SAEB are respectively forced to logic high and logic low levels to enable sense amplifier 41 to amplify the differential signal present on datalines DLB and DL. When the voltage at dataline DLB is more positive than that at dataline DL, transistor MN1 becomes more conductive than transistor MN0, while concurrently, transistor MP0 becomes more conductive than transistor MP1. As a result, transistors MN1 and MN2 tend to pull down the voltage at dataline DL relative to dataline DLB, while transistors MP0 and MP2 tend to pull up the voltage at dataline DLB. This complementary pulling down and pulling up of datalines DLB and DL are reinforced by each other, thereby causing transistors MP0 and MN1 to be turned on hard while transistors MP1 and MN0 are turned off. As a result, the voltages at datalines DLB and DL are quickly and abruptly forced to the VDD and VSS voltages, respectively.

Conversely, when the voltage at dataline DLB is more negative than that at dataline DL, transistor MN1 becomes less conductive than transistor MN0, while concurrently, transistor MP0 becomes less conductive than transistor MP1. As a result, transistors MN0 and MN2 tend to pull down the voltage at dataline DLB relative to dataline DL, while transistors MP1 and MP2 tend to pull up the voltage at dataline DL. This complementary pulling down and pulling up of datalines DLB and DL are reinforced by each other, thereby causing transistors MP1 and MN0 to be turned on hard while transistors MP0 and MN1 are turned off. As a result, the voltages at datalines DL and DLB are quickly and abruptly forced to the VDD and VSS voltages, respectively.

Equalizers $43_1$ and $43_2$ are implemented in this embodiment with N-channel transistor MN5 and P-channel transistor MP5, respectively. The gates of transistors MN5 and MP5 are respectively connected to receive enable signals DLEq and IOEq. In other embodiments, more than one N-channel or P-channel transistor can be used for the single N-channel or P-channel transistor equalizers, and the one or more N-channel transistors can be replaced with CMOS passgates or P-channel transistors, or vice versa.

Switches $45_{1B}$ and $45_1$ are implemented with N-channel transistors MN3, MN4, respectively. Switches $45_{2B}$ and $45_2$ are implemented with P-channel transistors MP3 and MP4, respectively. The gates of transistors MN3 and MN4 are connected to receive enable signal DLEn, whereas the gates of transistors MP3 and MP4 are Connected to receive enable signal IOEnB. In other embodiments, these switches may be implemented with other types of switches, such as CMOS passgates or transistors of opposite types. The operation of this embodiment is described below in conjunction with FIGS. 8–11, with FIG. 7 illustrating an embodiment of a control circuit that can be used to generate the control signals.

Figure 7:
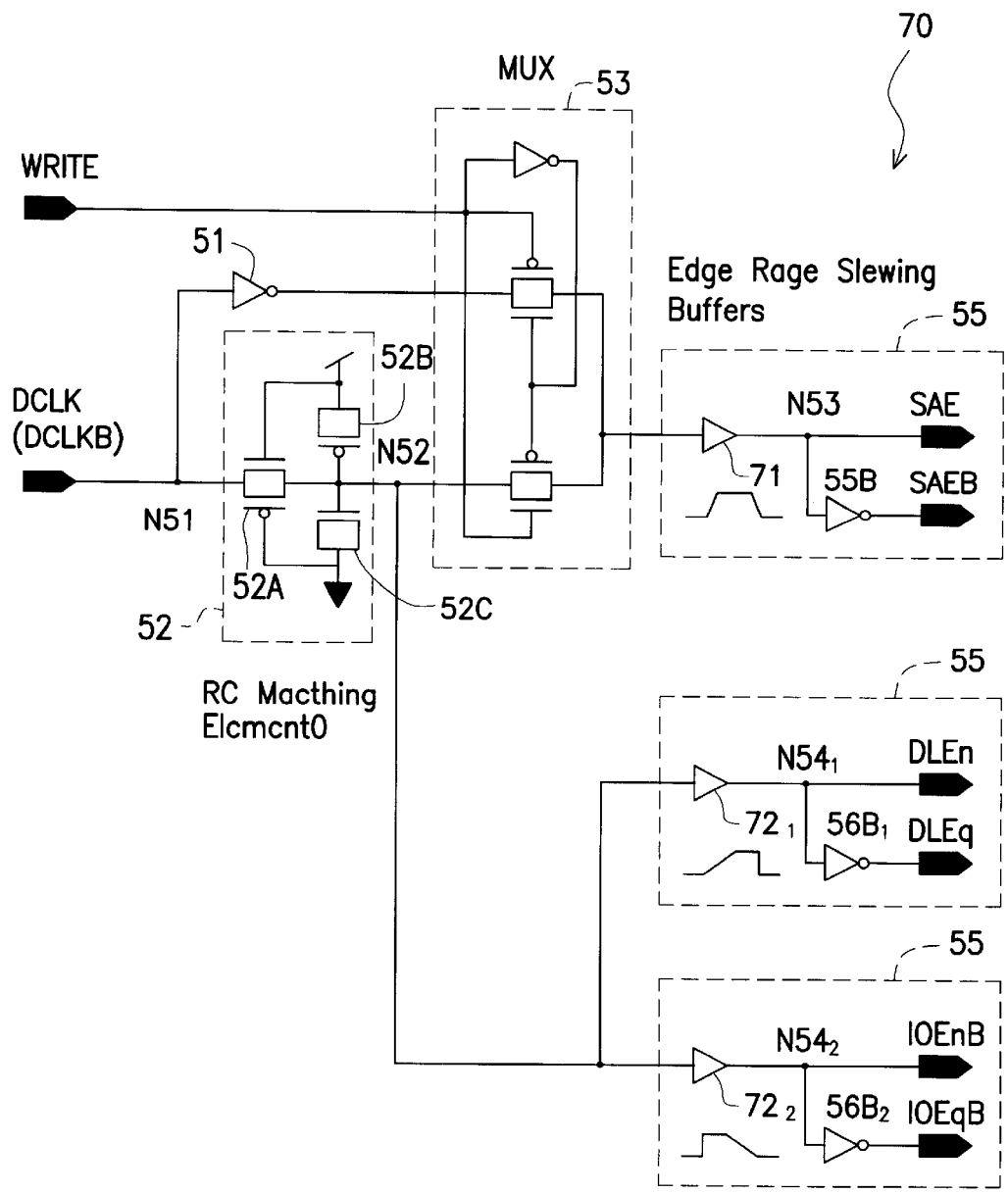
FIG. 7 is a diagram schematically illustrating one implementation of the zero skew control signal generation circuitry of FIG. 5.

FIG. 7 schematically illustrates one implementation of a control circuit 70, according to one embodiment of the present invention. In this embodiment, control circuit 70 is similar to control circuit 50 (FIG. 5) except that: (a) signals EN1 and EQ1 are renamed as signals DLEn and IOEnB, respectively; (b) signals EQ1 and EN2 are renamed as signals DLEq and IOEqB, respectively; (c) buffer 56 is implemented with two buffers $56_1$ and $56_2$ so that signals DLEn and DLEq are generated separately from signals IOEnB and IOEqB; and (d) RC matching element 55A is replaced with edge rate slew buffer 71 and RC matching element 56A is replaced with edge rate slew buffers $72_1$ and $72_2$. It will be appreciated by those skilled in the art that in embodiments using switches and equalizers of different conductivities, the polarities of these signals will be reversed.

In this embodiment, RC matching element 52 is implemented using a passgate 52A as the resistive element and using a P-channel transistor 52B and an N-channel transistor 52C as the capacitive element, as shown in FIG. 7. In addition, multiplexer 53 is implemented with passgates 53A and 53B, which are connected so that a logic low level of signal WRITE will turn on passgate 53A and turn off passgate 53B and a logic high level of signal WRITE will turn on passgate 53B and turn off passgate 53A.

In this implementation, RC matching element 55A is not realized. Instead, edge rate slewing buffer 71 is inserted between multiplexer 53 and node N53 in buffer 55. Edge rate slewing buffer 71 is implemented with a pair of substantially balanced inverters (i.e., where the pull-up devices have the same strength as the pull-down devices) to provide essentially the same rising and falling edge slew rate. Similarly, edge rate slew buffers $72_1$ and $72_2$ are inserted between nodes N52 and $N54_1$, and between nodes N52 and $N54_2$, respectively. The rising and falling edges of signals SAE, SAEB, DLEn, DLEq, IOEnB and IOEqB can be slewed differently to yield some positive setup time between any two appropriate signal edges. For example, to achieve a relatively slow rising edge slew rate and a relatively fast falling edge slew rate (shown in buffer $56_1$), edge rate slewing buffer $72_1$ would have relatively weak pull-up devices and relatively strong pull-down devices. In contrast, to achieve a relatively fast rising edge slew rate and a relatively slow falling edge slew rate (shown in buffer $56_2$), edge rate slewing buffer $72_2$ would have relatively strong pull-up devices and relatively weak pull-down devices. The margins can be tuned to meet the basic requirement of the RC delay matching, and to further minimize the crowbar currents. In this implementation, edge rate stewing buffer $72_1$ is made to achieve slow rising and fast falling edges, whereas $72_2$ is made to achieve fast rising and slow falling edges. Edge rate slewing buffer 71 is configured to achieve rising and falling edges of similar speed, but faster than the slow edges of buffers $72_1$ and $72_2$, and slower than the fast edges of buffers $72_1$ and $72_2$. The fast and slow edges of buffers $72_1$ and $72_2$ can be reversed if opposite types of transistors are employed for the switches.

Figure 8:
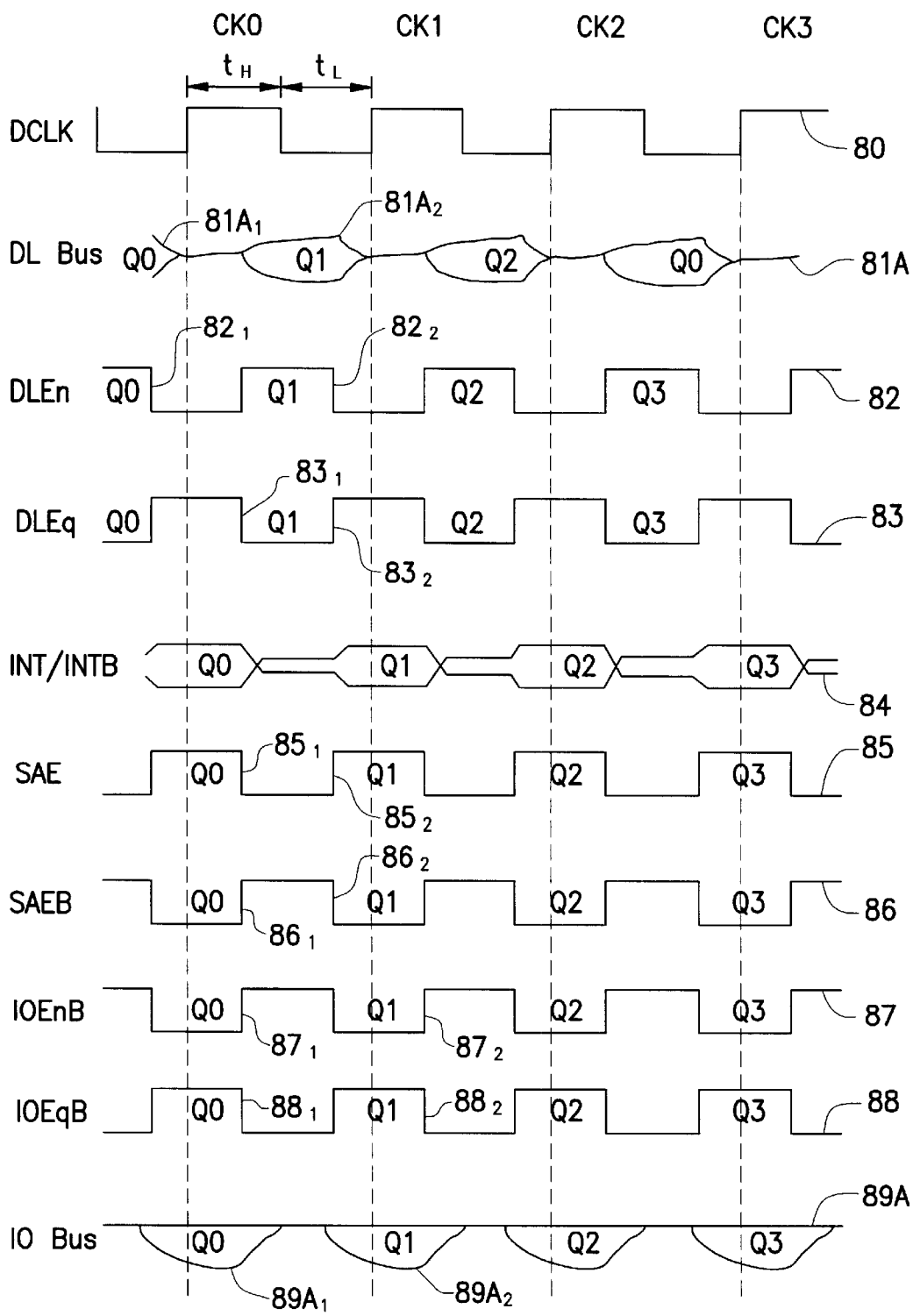
FIG. 8 is a diagram illustrating the timing of a read operation of the implementation of FIG. 6.

FIG. 8 is a diagram illustrating the timing of a read operation of sense amplifier stage 40 (FIG. 6). Waveforms 80, 82, 83, 87 and 88, respectively, represent signals DCLK, DLEn, DLEq, IOEnB and IOEqB as described above in conjunction with FIG. 6 and FIG. 7. The voltage level at DL bus $49_1$ is represented by a waveform 81. Signals SAE and SAEB are represented by waveforms 85 and 86. Waveforms 85 and 86 are also complementary in this embodiment. The voltage level at IO bus $49_2$ is represented by a waveform 89. As can be seen in FIG. 8, during a read operation signals DLEn, IOEnB, and SAEB are substantially identical, and signals DLEq, IOEqB and SAE are substantially identical. These two groups of signals are complementary to each other.

Referring to FIGS. 6 and 8, sense amplifier stage 40 performs read operations as follows. At the start of a clock cycle CK0, signals IOEnB, IOEqB, SAE, SAEB, DLEn, and DLEq are initially at levels that turn off switches $45_{1B}$ and $45_1$, turn on equalizer $43_1$, enable sense amplifier 41, turn on switches $45_{2B}$ and $45_2$ and turn off equalizer $43_2$. Consequently, sense amplifier 41 is in effect isolated from DL bus $49_1$ and driving the data toward IO bus $49_2$. Thus, the voltage levels at sense nodes N41B and N41 reflect the data currently latched in sense amplifier 41. In this example, this data is Q0, as indicated by portion $81_1$ of waveform 81.

As can be seen, data Q0 was provided at DL bus $49_1$ before the start of clock cycle CK0. Therefore, the read operation crosses the boundary between CK0 and the previous clock cycle.

Then signals IOEnB and IOEqB transition to logic high and logic low levels, respectively, as indicated by edges $87_1$ and $88_1$, thereby turning off switches $45_{2B}$ and $45_2$ and equalizing IO bus $49_2$. In addition, signals DLEn and DLEq respectively transition to logic high and logic low levels to turn on switches $45_{1B}$ and $45_1$ and turn off equalizer $43_1$, as indicated by edges $82_1$ and $83_1$. At about the same time, signals SAE and SAEB respectively transition to logic low and logic high levels to disable sense amplifier 41, as indicated by edges $85_1$ and $86_1$. Basically, signals DLEn, DLEq, SAE and SAEB are controlled during a read operation to receive read data by coupling sense amplifier 41 to DL bus $49_1$ while essentially simultaneously disabling sense amplifier 41. This timing disconnects the paths to the power supply bus Vdd and ground bus VSS of sense amplifier 41 so that sense amplifier 41 presents a relatively small capacitive load on datalines DLB and DL. This feature allows the data to quickly develop at nodes N41B and N41. Also at about the same time, read data Q1 is provided at DL bus $49_1$, as indicated by portion $81_2$ of waveform 81. Consequently, sense amplifier 41 receives read data Q1 during clock cycle CK0, in preparation for sensing by sense amplifier 41 at the start of the next clock cycle CK1. The process described above then repeats for latching and driving read data Q1 on IO bus $49_2$ and so on.

Figure 9:
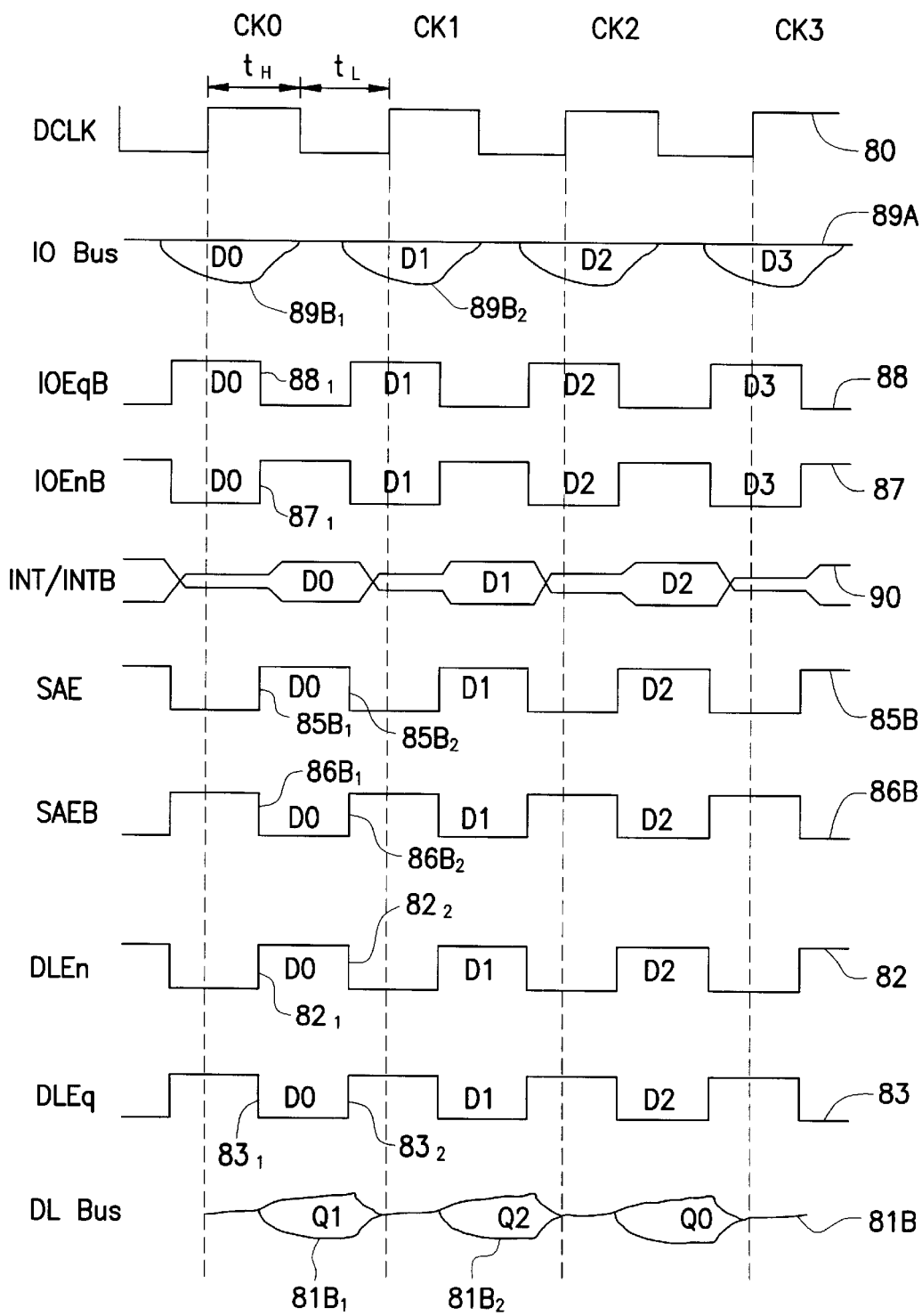
FIG. 9 is a diagram illustrating the timing of a write operation of the implementation in FIG. 6.

FIG. 9 is a timing diagram illustrating a write operation of sense amplifier stage 40 (FIG. 6). The clock signal is represented by a waveform 80. The voltage at IO bus $49_2$ is represented by a waveform 89. Enable signal IOEnB and equalize signal IOEqB are represented by waveforms 87 and 88. In this embodiment, waveforms 87 and 88 are complementary. Signals SAE and SAEB are represented by waveforms 85B and 86B. Waveforms 85B and 86B are also complementary in this embodiment. As can be seen in FIG. 9, during a write operation, signals IOEnB and SAE are substantially identical, and signals IOEqB and SAEB are substantially identical. Enable signal DLEn and equalize signal DLEq are represented by waveforms 82 and 83, which are also identical to IOEnNB and IOEqB respectively in this embodiment. The voltage level at DL bus $49_1$ is represented by a waveform 81.

Referring to FIGS. 6, 7 and 9, sense amplifier stage 40 performs write operations as follows. At the start of a clock cycle CK0, the data to be written appears on IO bus $49_2$. In addition, signals IOEnB, IOEqB, SAE, SAEB, DLEn, and DLEq are initially at levels that turn on switches $45_{2B}$ and $45_2$, turn off equalizer $43_2$, disable sense amplifier 41, turn off switches $45_{1B}$ and $45_1$, and turn on equalizer $43_1$. Consequently, sense amplifier 41 is in effect isolated from DL bus $49_1$ (which is equalized), but coupled to IO bus $49_2$ to receive the data appearing at IO bus as indicated by portion $89_1$ of waveform 89.

Then signals IOEnB and IOEqB respectively transition to logic high and logic low levels to turn off switches $45_{2B}$ and $45_2$ and turn on equalizer $43_2$ as indicated by edges $87_1$ and $88_1$, which isolates sense amplifier from IO bus $49_2$. In addition, signals SAE and SAEB respectively transition to logic high and logic low levels as indicated by edges $85B_2$ and $86B_2$, thereby enabling sense amplifier 41. As a result, sense amplifier 41 can begin sensing and latching the developing data at sense nodes N41B and N41. At about the same time, signals DLEn and DLEq respectively transition to logic high and logic low levels, thereby turning on switches $45_{1B}$ and $45_1$, and turning off equalizer $43_1$. Consequently, sense amplifier 41 can drive the latched data to DL bus $49_1$, thereby completing the write cycle and returning the control signals to the initial states (described above for the start of clock cycle CK0) in preparation for the start of the next clock cycle CK1. The process described above then repeats for writing the next data D1 and so on.

As can be seen in FIGS. 8 and 9, all of the control signals have the same pulse width and same delay from a referred clock edge because of the absence of the precharge phase and also because of the zero setup time requirements. Only signals SAE and SAEB are inverted back and forth to change the operation modes. The duration of logic high $t_H$ and logic low $t_L$ determine how much time it is available for the signal development on DL bus and IO bus respectively. The ratio can be adjusted to optimized the sizes of the drivers in the upstream and in the downstream. Although FIG. 8 shows the control signals having a 50% duty cycle, the duty cycles can be altered to meet different timing requirements, while still keeping them substantially identical (or identical to the complement) of clock signal DCLK. Accordingly, generating the control signals for both read and write operations are significantly simplified compared to the aforementioned conventional systems.

Figure 10:
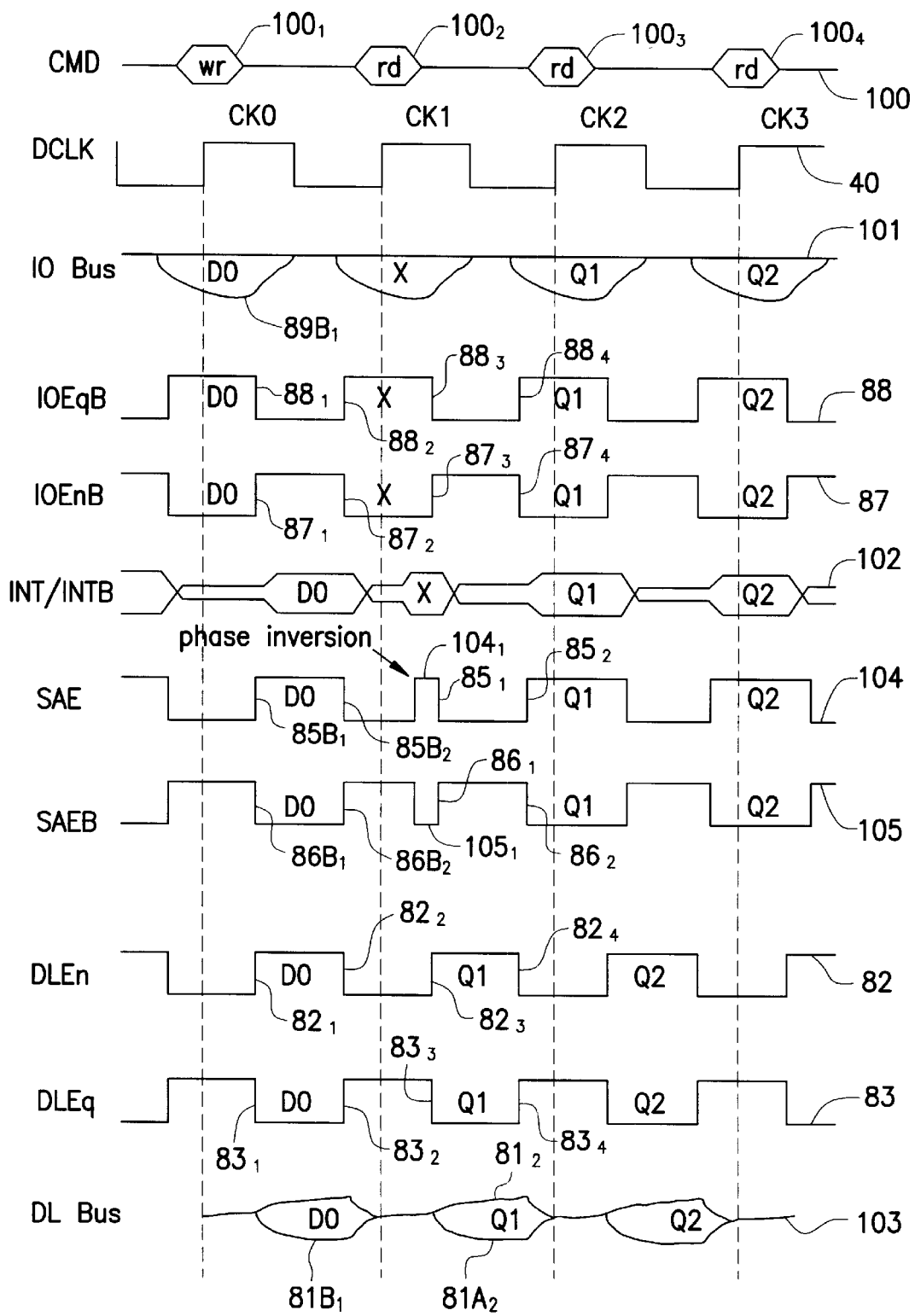
FIG. 10 is a diagram illustrating the timing of a write operation followed by a read operation in the implementation of FIG. 6.

FIG. 10 illustrates the timing of a write operation followed by a read operation in sense amplifier stage 40 (FIG. 6). Waveform 100 represents the timing of the write and read commands. The voltage levels at IO bus $49_2$, sense nodes N41B and N41, and DL bus $49_1$ are represented by waveforms 101–103, respectively. Signals SAE and SAE B are represented by waveforms 104 and 105, respectively. Signals DCLK, IOEqB, IOEnB, DLEn and DLEq are represented by waveforms 40, 88, 87, 82 and 83 as described above for FIG. 8.

Sense amplifier stage 40 performs a write cycle in substantially the same way as described above in conjunction with FIG. 9. However, towards the end of clock cycle CK0, write data is not provided at IO bus $49_2$ as in a normal write cycle. Then, early in the next clock cycle CK1, before all of the control signals transition (as described above in conjunction with FIG. 9), signals SAE and SAEB are inverted, as indicated by edges $104_1$ and $105_1$. Shortly afterwards, all of the control signals transition so that signals SAE and SAEB have edges $85B_1$ and $86B_1$, respectively. Thus, waveforms 88, 87, 82 and 83 remain as described above in conjunction with FIG. 9, but signals SAE and SAEB (waveforms 104 and 105) are inverted relative to waveforms 85B and 86B (FIG. 9), respectively. Thus, at this point waveforms 104 and 105 are equivalent to waveforms 85 and 86 (FIG. 8), respectively. Accordingly, the timing of signals IOEqB, IOEnB, SAE, SAEB, DLEn and DLEq are now equivalent to the timing of these signals as described above in conjunction with FIG. 8 (i.e., a read operation). Then, as described above in conjunction with FIG. 8, sense amplifier stage 40 performs a read cycle in clock cycle CK1.

Figure 11:
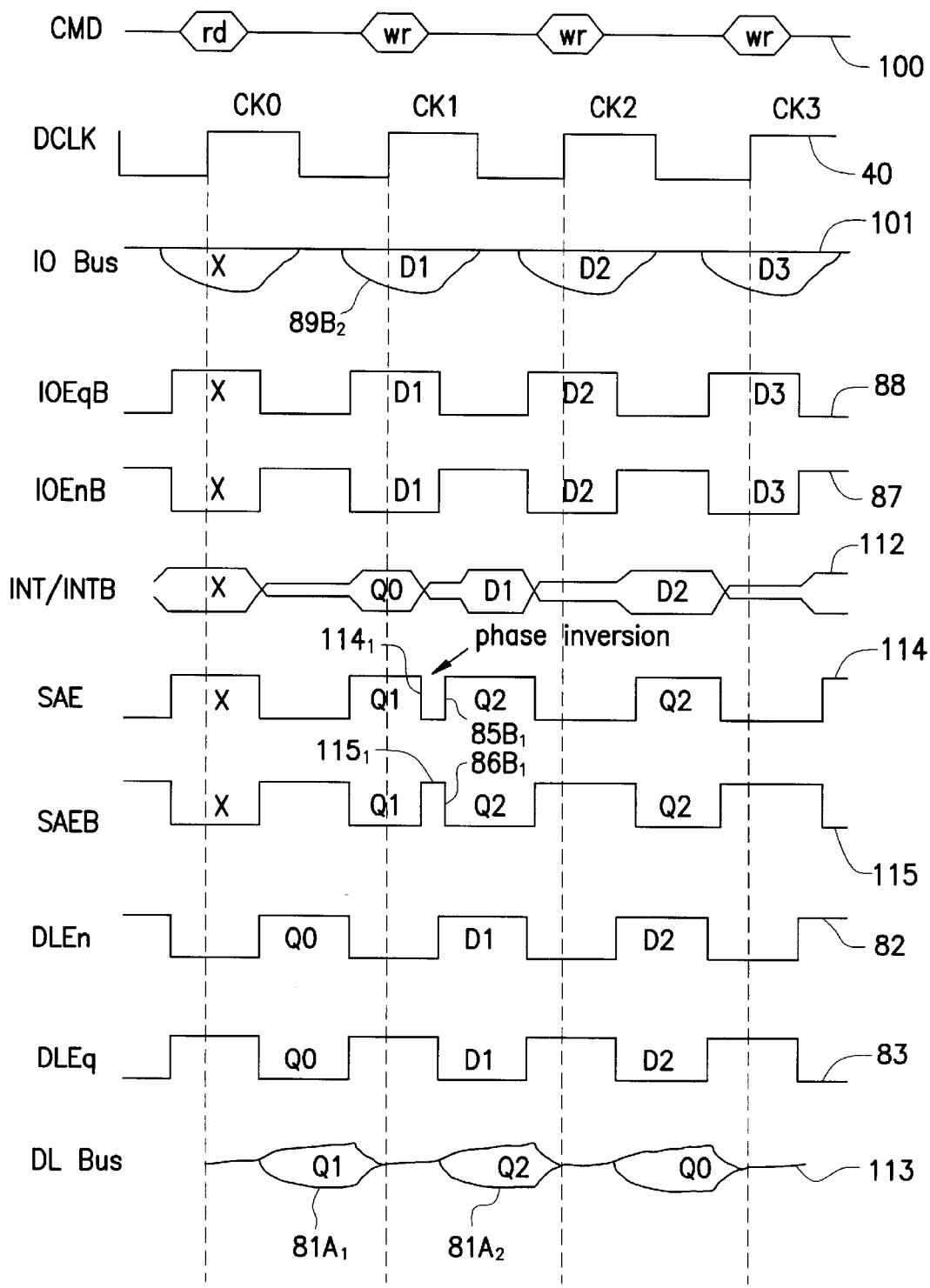
FIG. 11 is a diagram illustrating the timing of a read operation followed by a write operation in the implementation of FIG. 6.

FIG. 11 illustrates the timing of a read operation followed by a write operation in sense amplifier stage 40 (FIG. 6). Waveform 110 represents the timing of the write and read commands. The voltages at IO bus $49_2$, sense nodes N41B and N41, and DL bus $49_1$ are represented by waveforms 111–113, respectively. Signals SAE and SAEB are represented by waveforms 114 and 115, respectively. Signals DCLK, IOEqB, IOEnB, DLEn and DLEq are represented by waveforms 40, 88, 87, 82 and 83 as described above for FIG. 8.

Sense amplifier stage 40 performs a read cycle in substantially the same way as described above in conjunction with FIG. 8. However, towards the end of clock cycle CK0, read data Q0 is not provided at IO bus $49_2$ as in a normal read cycle. Instead, read data Q0 is invalidated early in the next clock cycle CK1 when signals SAE and SAEB are inverted, as indicated by edges $114_1$ and $115_1$. Shortly afterwards, all of the control signals transition so that signals SAE and SAEB have edges $85B_1$ and $86B_1$, respectively. Thus, waveforms 88, 87, 82 and 83 remain as described above in conjunction with FIG. 8, but signals SAE and SAEB (waveforms 114 and 115) are inverted relative to waveforms 85 and 86 (FIG. 8), respectively. Thus, at this point waveforms 114 and 115 are equivalent to waveforms 85B and 86B (FIG. 9), respectively. Accordingly, the timing of signals IOEqB, IOEnB, SAE, SAEB, DLEn and DLEq are now equivalent to the timing of these signals as described above in conjunction with FIG. 9 (i.e., a write operation). Then, as described above in conjunction with FIG. 9, sense amplifier stage 40 performs a write operation in clock cycle CK1.

Figure 12:
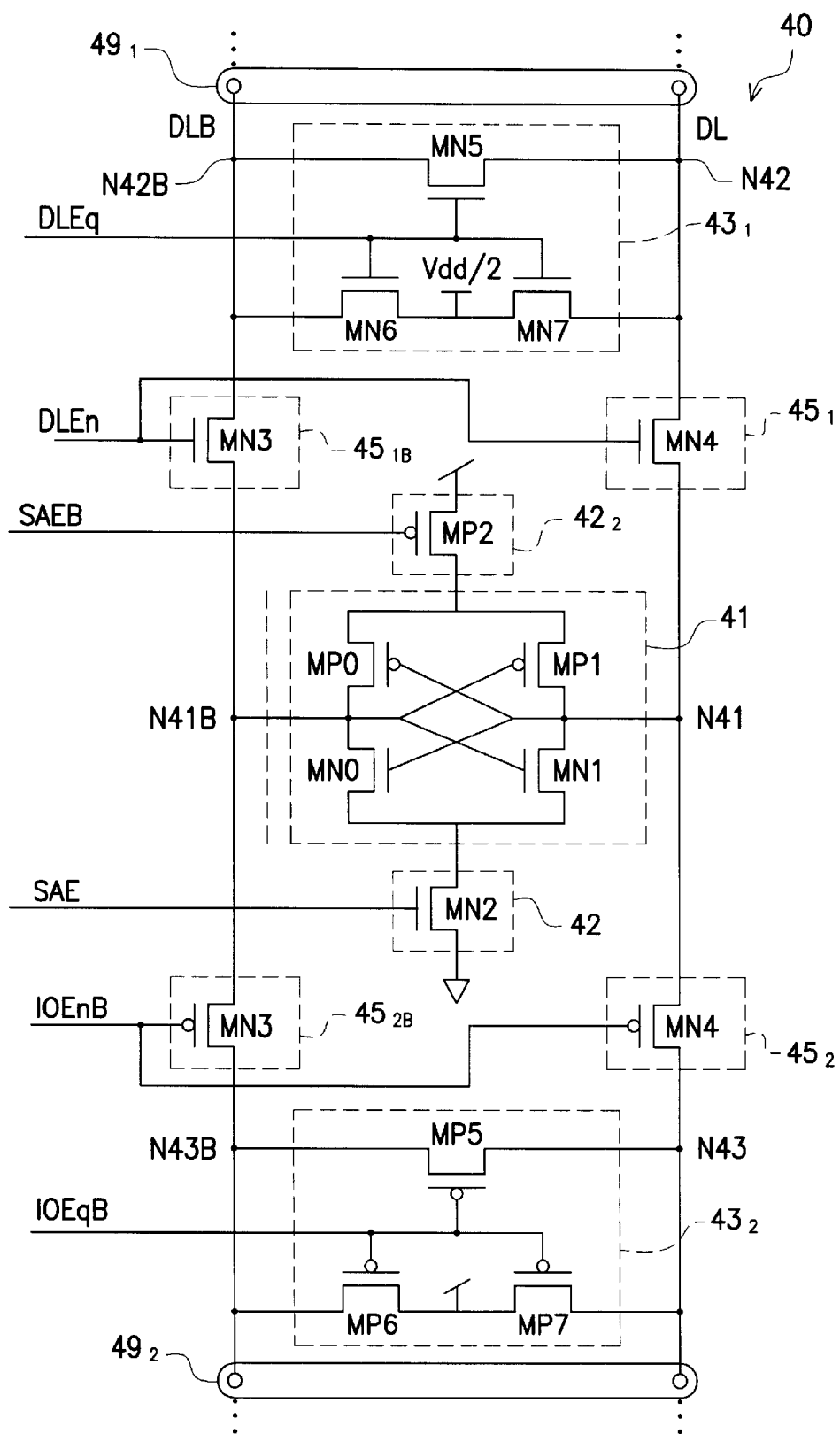
FIG. 12 is a diagram schematically illustrating another implementation of the bi-directional sense amplifier stage of FIG. 4.

FIG. 12 illustrates a bi-directional sense amplifier stage 120 according to another embodiment of the present invention. Sense amplifier stage 120 is substantially similar to sense amplifier stage 40 (FIG. 6), except that sense amplifier stage 120 includes some pre-charge circuitry and implements equalizer $43_1$ differently. More specifically, sense amplifier stage 120 includes N-channel precharge transistors MN6 and MN7 electrically connected to nodes N12B and N12, respectively, to precharge nodes N12B and N12 to a voltage level of ½VDD. The gates of transistors MN6 and MN7 are connected to the gate of transistor MN5, which are connected to receive a precharge signal DLEq. Similarly, sense amplifier stage 120 includes P-channel precharge transistors MP6 and MP7 electrically connected to nodes N43B and N43, respectively, to precharge nodes N43B and N43 to a voltage level of VDD. The gates of transistors MP6 and MP7 are connected to the gate of transistor MP5, which are also connected to receive a precharge signal IOEqB. As previously described, the conductivities of the various equalizer precharge devices can be changed in other embodiments, with appropriate inversion of the control signals received by these devices.

Figure 13:
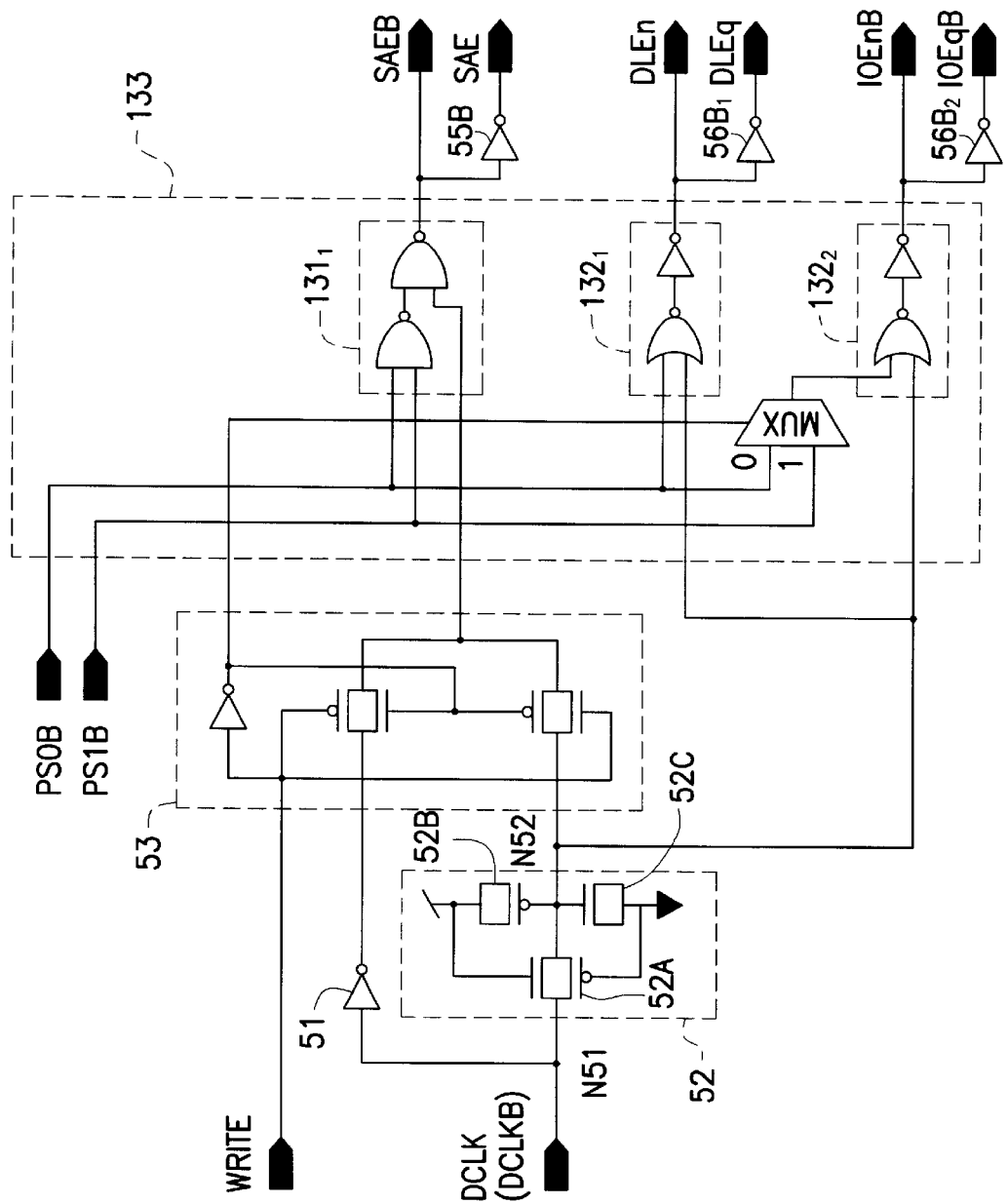
FIG. 13 is a diagram schematically illustrating another implementation of the control circuitry of FIG. 5 for use with the memory access that activates different groups of bi-directional sense amplifier stages in different pipeline stages.

FIG. 13 illustrates a control circuit 130 configured to generate the control signals for sense amplifier stage 40 (FIGS. 6 and 12). Circuit 130 includes a NAND-NAND pair 131, two NOR-Inverter pairs $132_1$ and $132_2$, a first multiplexer 53, inverters 51, RC delay match circuits 52, and a second multiplexer 133.

Circuit 130 is interconnected as follows. In this embodiment, NAND-NAND pair 131 implements gating logic with input leads connected to receive clock signal DCLK via multiplexer 53 and pipeline stage selection signals PS0B and PS1B. Basically, signal PS0B is used to select a group of sense amplifier stages among other groups of sense amplifier stages. Signal PS1B is generated by latching signal PS0B and holding it for an extra clock cycle. Signal PS0B, when at a logic low level, indicates that the sense amplifier stage is selected for a data transfer and is at its first pipeline stage. Signal PS1B, when at a logic low level, indicates that the current transfer is still ongoing and the sense amplifier needs to stay selected for an extended period of time. The output signal from NAND-NAND pair 131 and its inverse serve as signals SAEB and SAE, respectively. NOR-Inverter pair 132$_1$ is a two-input OR with input leads connected to receive pipeline stage selection signal PS0B and clock signal DCLK. The output signal of NOR-Inverter pair 132$_1$ and its inverse serve as signals DLEn and DLEq, respectively. NOR-Inverter pair 132$_2$ is a two-input OR with input leads connected to receive clock signal DCLK (via RC matching element 52) and the output signal of multiplexer 133. The output signal of NOR-Inverter pair 1322 and its inverse serve as signals IOEnB and IOEqB, respectively. NAND-NAND pair 131 and NOR-Inverter pairs 132$_1$, and 132$_2$, in this implementation of circuit 130 serve as gating circuitry as well as edge rate slewing buffers. Multiplexer 133 is a two-input multiplexer with its input leads connected to receive pipeline stage selection signals PS0B and PS1B, and its control lead connected to receive a Read Select signal. The Read Select signal is set at a logic high level during read operations. RC matching element 52 has its lead connected to receive clock signal DCLK and has its output lead connected to the input leads of multiplexer 53. The output leads of inverter 51 and RC matching element 52 are connected to the input leads of two-input multiplexer 53.

Circuit 130 operates as follows. Multiplexer 53 is controlled by signal WRITE to propagate either clock signal DCLK or DCLKB to NAND-NAND pair 131. The selected clock signal is passed through NAND-NAND pair 131 as signal SAEB only when signals PS0B and PS1B are both at logic low levels, indicating that a data transfer operation is taking place with this sense amplifier stage. If one or both of signals PS0B and PS1B are at a logic high level, NAND-NAND pair 131 outputs signal SAEB at a logic high level independently of the logic state of the selected clock signal.

NOR-Inverter pair 132$_1$ gates clock signal DCLK in response to signal PS0B. That is, when signal PS0B is at a logic low level, NOR-Inverter pair 132$_1$ outputs clock signal DCLK to serve as signal DLEn. When signal PS0B is at a logic high level, NOR-Inverter pair 132$_2$ holds signal DLEn at a logic high level.

Similarly, NOR-Inverter pair 132$_2$ gates clock signal DCLK in response to either signal PS0B or PS1B, as provided by multiplexer 133. Multiplexer 133 is controlled by the Read signal to provide signal PS0B during write operations and to provide signal PS1B during read operations. Referring to FIG. 8, signals IOEnB and IOEqB stay at logic low across the clock cycle boundary to send the data onto the IO bus (see waveform 89A) during a read operation. The status of the selection on the current sense amplifier stage will be carried through the operation by first asserting signal PS0B in the first clock cycle and then asserting signal PS1B in the following cycle. In write operations, the data transfer is completed in one clock cycle as shown in FIG. 9. Therefore, there is no need to extend the selection status over the cycle boundary using signal PS1B.

The embodiments of the bi-directional sense amplifier stage described above are illustrative of the principles of the present invention and are not intended to limit the invention to the particular embodiments described. For example, in light of the present disclosure, those skilled in the art can devise without undue experimentation embodiments using sense amplifier circuits with the switches and equalizers different from those described. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of sensing data signals propagating on a bi-directional data path using a sense amplifier stage having a sense node coupled to the datapath, the datapath having a first direction in which data signals can propagate and having a second direction in which data signals can propagate, the method comprising:

providing a first data signal in the first direction of the datapath during a first clock cycle;

receiving the first data signal using the sense amplifier stage, the sense amplifier stage having a single sense amplifier configured to sense data signals propagating in both the first and second directions of the datapath, wherein the sense node of the single sense amplifier is not precharged during operation of the sense amplifier stage; and enabling the single sense amplifier, wherein in response thereto the single sense amplifier amplifies the first data signal, the amplified first data signal being propagated in the first direction of the datapath.

2. The method of claim 1, wherein a single clock signal is used to generate all control signals for the sense amplifier stage.

3. The method of claim 1, further comprising:

providing a second data in the second direction of the datapath during a second clock cycle, the second clock cycle being the next sequential clock cycle after the first clock cycle;

receiving the second data signal using the sense amplifier stage and the single sense amplifier, wherein the sense node of the single sense amplifier is not precharged during operation of the sense amplifier stage;

enabling the single sense amplifier, wherein in response thereto the single sense amplifier amplifies the second data signal, the amplified second data signal being propagated in the second direction of the datapath.

4. The method of claim 3 further comprising storing data corresponding to the first amplified data signal during the second clock cycle while the second data signal is provided in the second direction on the datapath during the second clock cycle.

5. The method of claim 2 wherein the control signals have the same duty cycle as the single clock signal.

6. The method of claim 2 wherein the control signals are essentially equivalent to the clock signal or the inverse of the clock signal.

7. The method of claim 1 wherein the sense amplifier stage is part of a memory circuit.

8. The method of claim 1 wherein the single sense amplifier includes a pull-up strobe device and a pull-down strobe device, the pull-up and pull-down strobe devices being turned on in enabling the single sense amplifier.

9. The method of claim 1 wherein receiving the first data signal further comprises:

coupling the sense node to one end of the datapath to receive the first data signal; and isolating the sense node from another end of the datapath.

10. The method of claim 1, wherein enabling the single sense amplifier further comprises isolating the sense node from one end of the datapath from which the first data signal propagated to the sense node; and coupling the sense node to another end of the datapath to propagate the amplified first data signal in the first direction on the datapath.

11. A sense amplifier stage configured to be used in a bi-direction datapath, the datapath having a first direction in which data signals can propagate and having a second direction in which data signals can propagate, the sense amplifier stage comprising:

a first transfer port disposed in the datapath;

a second transfer port disposed in the datapath;

a sense node;

a first switch coupled to the first transfer port and the sense node;

a second switch coupled to the second transfer port and the sense node; and a sense amplifier coupled to the sense node, wherein the sense amplifier is configured, when enabled, to sense and amplify data signals propagating in both the first and second directions of the datapath, and wherein the sense node of the single sense amplifier is not pre-charged during operation of the sense amplifier stage.

12. The sense amplifier stage of claim 11 further comprising:

a first equalizer coupled to the datapath between the first transfer port and the first switch; and a second equalizer coupled to the datapath between the second transfer port and the second switch.

13. The sense amplifier stage of claim 12 wherein a single clock signal is used to generate control signals for the first and second switches, first and second equalizers and the sense amplifier.

14. The sense amplifier stage of claim 13 wherein the control signals have the same duty cycle as the single clock signal.

15. The sense amplifier stage of claim 14 wherein the control signals are essentially equivalent to the clock signal or the inverse of the clock signal.

16. The sense amplifier stage of claim 11 further comprising a pipeline stage, wherein in response to the sense amplifier stage amplifying a first data signal provided in the first direction at the first transfer port during a first clock cycle, the pipeline stage is configured to store data corresponding to the amplified first data signal during the second clock cycle while a second data signal is provided in the second direction at the second transfer port during the second clock cycle.

17. The sense amplifier stage of claim 11 wherein the sense amplifier includes a pull-up strobe device and a pull-down strobe device, the pull-up and pull-down strobe devices being turned on when the sense amplifier is enabled and being turned off when the sense amplifier is disabled.

18. The sense amplifier stage of claim 11 where in the sense amplifier stage is configured such that when receiving a data signal provided at the first transfer port, the first switch is turned on, the second switch is turned off, and the sense amplifier is disabled.

19. The sense amplifier stage of claim 18 wherein the sense amplifier stage is further configured such that the first switch is turned off, the second switch is turned on and sense amplifier is enabled so that then sense amplifier stage amplifies and propagates the data signal received at the first transfer port to the second transfer port.

20. The sense amplifier stage of claim 12 wherein the sense amplifier stage is configured such that, in receiving a data signal provided at the first transfer port, the first switch and second equalizer are turned on, the first equalizer and the second switch are turned off and the sense amplifier is disable.

21. The sense amplifier stage of claim 20 wherein the sense amplifier stage is further configured to amplifier and propagate the data signal received at the first transfer port to the second transfer port by turning off the first switch and the second equalizer, turning on the first equalizer and the second switch and by enabling the sense amplifier.

22. The sense amplifier stage of claim 13 wherein the control signals for the first and second switches and the first and second equalizers are the same for propagating data signals in the both the first and second directions.

23. The sense amplifier stage of claim 22 wherein a control signal for the sense amplifier in propagating data signals in the first direction is inverted in propagating data signals in the second direction.

24. The sense amplifier stage of claim 13 wherein a control signal for the first switch is the inverse of a control signal for the first equalizer.

25. The sense amplifier of claim 24 wherein the control signal for the first switch is the inverse of a control signal for the second switch and equivalent to a control signal for the second equalizer.

26. The sense amplifier stage of claim 13 wherein a control signal for the first switch is the same as a control signal for the first equalizer, the conductivities of the first switch and first equalizer being different.

27. The sense amplifier stage of claim 26 wherein the control signal for the first switch is the same as a control signal for the second switch and the inverse to a control signal for the second equalizer.

* * * * *